(12) United States Patent
Dörr et al.

(10) Patent No.: US 6,667,142 B2
(45) Date of Patent: Dec. 23, 2003

(54) RECORDING MATERIAL HAVING A PIGMENT-COLOURED RADIATION-SENSITIVE LAYER

(75) Inventors: Michael Dörr, Mainz (DE); Andreas Elsässer, Idstein (DE)

(73) Assignee: AGFA-Gevaert (BE)

( * ) Notice: Subject to any disclaimer, the term of this patent is extended or adjusted under 35 U.S.C. 154(b) by 85 days.

(21) Appl. No.: 09/978,148

(22) Filed: Oct. 16, 2001

(65) Prior Publication Data

US 2002/0068234 A1 Jun. 6, 2002

(30) Foreign Application Priority Data

Oct. 18, 2000 (DE) .......................... 100 51 577

(51) Int. Cl.[7] .............................. G03F 7/021; G03F 7/30
(52) U.S. Cl. ...................... 430/157; 430/176; 430/302; 430/281.1
(58) Field of Search ................................ 430/157, 176, 430/302, 281.1

(56) References Cited

U.S. PATENT DOCUMENTS

| 5,286,594 A | * | 2/1994 | Sypek et al. ................. 430/138 |
| 5,340,681 A | * | 8/1994 | Sypek et al. ................. 430/138 |
| 5,543,262 A | * | 8/1996 | Sypek et al. ................. 430/162 |
| 6,197,472 B1 | * | 3/2001 | Konrad et al. ............... 430/157 |

FOREIGN PATENT DOCUMENTS

| EP | 0 575 802 | 12/1993 |
| EP | 0 729 069 | 8/1996 |
| EP | 0 738 931 | 10/1996 |
| EP | 0 778 497 | 6/1997 |
| WO | 99/51690 | 10/1999 |

* cited by examiner

*Primary Examiner*—John S. Chu
(74) *Attorney, Agent, or Firm*—Connolly Bove Lodge & Hutz LLP

(57) ABSTRACT

The invention relates to a recording material having a substrate and a negative-working, radiation-sensitive layer which contains a diazonium salt, at least one film-forming, polymeric binder and organic colored pigments, on the surface of which an organic polymeric dispersant has been adsorbed and which are additionally dispersed in an organic polymeric binder which does not permanently combine with the pigments chemically or physically. The dispersant generally has groups, in particular primary, secondary or tertiary amino groups or derivatives thereof, which act as anchor groups on the colored pigment particles. The pigments themselves are preferably phthalocyanine pigments. As a result of the predispersing, aggregation of the pigment particles is effectively prevented so that uniform coloration of the radiation-sensitive layer is achieved. During development of the imagewise exposed recording materials, the colored pigment particles form virtually no insoluble precipitates. In the prepared printing plates, the printing parts are distinguished from the substrate material through being clearly visible and having high contrast.

52 Claims, No Drawings

RECORDING MATERIAL HAVING A PIGMENT-COLOURED RADIATION-SENSITIVE LAYER

FIELD OF THE INVENTION

The present invention relates to a recording material having a substrate and a negative-working, radiation-sensitive layer which contains organic coloured pigments, a diazonium salt and at least one film-forming, polymeric binder.

BACKGROUND OF THE INVENTION

Recording materials of this or a similar type are already known. Thus, EP-A 152 819 (=U.S. Pat. No. 4,631,245) describes a negative-working recording material for the production of offset printing plates, the photosensitive layer of which recording material contains a diazonium salt polycondensate, a polymeric binder containing carboxyl groups, and optionally a dye and/or coloured pigments. For example, a paste of a blue copper phthalocyanine pigment (®Hostapermblau B2G), obtainable under the name ®Renolblau B2G-HW from Clariant Deutschland GmbH, in a modified polyvinylbutyral (®Mowital B30H) is used for colouring the layer. However, the pigments produced in this manner dissolve only slowly and to a limited extent in the coating solution, which limits the pigment content and hence the subsequently achievable image contrast. By prolonging the stirring time in the mixing vessel, it is possible to achieve better mixing but undesired sludge formation may occur in the case of larger solution batches. Copper-containing pigments moreover lead to an equally undesired enrichment of copper in the aqueous baths in which the recording materials are developed after the imagewise exposure. Copper phthalocyanine pigments as well as polyvinylbutyrals also dissolve only to a limited extent in aqueous alkaline developers, so that precipitates of layer components frequently form in the case of high developer loads. The precipitates in turn can impair the operation of the developing machines as well as that of the developed plates (by the formation of redeposits).

EP-A 778 497 relates to a negative-working recording material which is suitable in particular for the production of offset printing plates. The unexposed parts of the radiation-sensitive layer of the recording material can be removed using neutral or alkaline aqueous solutions. The layer contains predispersed pigments, preferably predispersed copper phthalocyanine pigments, a diazonium compound or a combination of a photopolymerizable compound and a photoinitiator, and a polymeric binder which is soluble but at least swellable in aqueous alkaline solutions. The binder is prepared by reacting a polymer containing hydroxyl groups with an anhydride, e.g. maleic anhydride or succinic anhydride, in the presence of a catalytically active amount of a tertiary amine. Anhydride-modified polyvinylacetals are disclosed as particularly suitable binders. The acid number of the binder is in general from 5 to 80. The binder also serves for dispersing the coloured pigments. In the pigment dispersion, the binder content is from 2 to 20% by weight. In addition, the pigment dispersion comprises from 60 to 96% by weight of an aliphatic ($C_1$–$C_8$)alcohol, of a ($C_1$–$C_8$) alkylene glycol mono- or di-($C_1$–$C_8$)alkyl ether (in particular 1-methoxypropan-2-ol) or of a cyclic ketone. The predispersing makes it possible to increase the content of the coloured pigments in the layer, which increases the image contrast in the developed recording material and in this way improves the visibility of the image. This measure simultaneously ensures that the layer is completely removed in the unexposed parts and already detached layer components are not redeposited, which would lead to background fogging or to scumming during subsequent printing. The predispersing is usually carried out in a ball mill. There, if an organic solvent having a relatively low boiling point is used (such as 1-methoxypropan-2-ol, which has a boiling point of from 118 to 119° C. at atmospheric pressure), then thorough cooling of the mill is therefore essential.

Attempts have also already been made to eliminate the described deficiencies of the recording materials known in the prior art. Thus, EP-A 738 931 discloses the colouring of a negative-working layer with heavy metal-free, in particular copper-free, predispersed phthalocyanine pigments. The predispersing is effected using a polyvinyl alcohol in water in the presence of a cationic surfactant. In this way, it is possible to produce stable dispersions which however can be used only in aqueous media. The pigment dispersion according to the EP-A is accordingly used in an aqueous photosensitive composition which contains a polyvinyl alcohol as a binder in addition to a water-soluble diazo resin or diazonium salt. The high content of polyvinyl alcohol in the layers thus prepared frequently leads to problems with ink acceptance during printing. Furthermore, such layers are not sufficiently resistant to the damping solution used during printing, so that only relatively short print runs can be achieved. In photosensitive mixtures which contain water-insoluble diazo or diazonium components and/or water-insoluble polymeric binders, the pigment dispersions practically cannot be used.

The non-prior-published DE-A 199 15 717 describes a recording material which is capable of substantially solving the problems described by using a coloured pigment dispersion. A copper-free phthalocyanine in an organic polymeric binder is dispersed therein. However, it has been found that the freedom from fogging which is mentioned there can be ensured only to a limited extent during the development process since in particular the developability of the coloured pigment particles of the recording material described there depends to a great extent on the drying temperatures used. This is due to the processes which take place in the wet film during the drying. At a high initial drying temperature, the kinetics of initial drying of the wet film change so that a layer having a different morphological structure forms. In particular, the coloured pigment particles are then no longer homogeneously distributed in the dried layer, which in turn means that completely fog-free development under critical conditions (less than 15 s development time, no mechanical support, for example by brushes, during development) is no longer possible. The instability of the dispersion in the coating solution during the drying process is presumably the main cause here. It is assumed that pigment particles agglomerate in this stage and form aggregates which can no longer be completely removed during the subsequent development and then give rise to fogging in the nonimage parts.

OBJECTS OF THE INVENTION

It is an object of the present invention to provide a negative-working recording material which is coloured with a coloured pigment dispersion and in which the image formed from the radiation-sensitive layer by imagewise exposure and subsequent development is intensely coloured and is distinguished from the substrate by high contrast. In particular, it should be possible to colour a nonaqueous negative-working photosensitive composition homogeneously with the coloured pigment dispersion. The dispersion should also be capable of being uniformly distributed in the nonaqueous photosensitive composition in a short time, and also in relatively large amounts, in order to achieve intense colouring. Moreover, the dispersion should solve the problems described and involving residual fogging with the use of high initial drying temperatures. All measures to improve the dispersion in this respect should have no adverse effects on the printing properties.

Even if the developer is already highly contaminated with layer components from the recording material, the coloured pigments should not be precipitated from the developer mixture or form deposits in the developing machine or on the developed plates. After development, the printing parts of the offset plate obtained from the recording material should be so clearly detectable that, if required, the plate can be corrected. The clear detectability is also important to enable the plate to be satisfactorily scanned by a scanner during preparation for printing.

SUMMARY OF THE INVENTION

The object is achieved by the use of coloured pigments which are predispersed in a polymeric, organic binder with the aid of dispersants having groups which have affinity to the pigments. By means of these groups, the dispersants are adsorbed onto the surface of each individual colour pigment particle and thus prevent a plurality of particles from agglomerating. The coloured pigments thus prepared give recording materials which can be substantially better developed under critical conditions. Surprisingly, it was possible to find dispersants which have no adverse effects at all on the printing properties, such as ink acceptance, resistance and the like.

The present invention accordingly relates to a recording material having a substrate and a negative-working, radiation-sensitive layer which contains organic colored pigments, a diazonium salt and a first polymeric binder, which is film-forming, the material being characterized in that an organic polymeric dispersant is adsorbed onto the surface of the organic colored pigments, and that the pigments are additionally dispersed in a second polymeric binder which does not permanently combine with them chemically or physically. Preferably, the second polymeric binder which is used for dispersing the colored pigments, also called herein "dispersion binder", is identical to the first, film-forming polymeric binder. The radiation-sensitive layer optionally also contains a combination of polymerizable monomer or oligomer and a photopolymerization initiator. In a preferred embodiment, the layer also contains transparent spacer pigments.

The dispersing of the organic colored pigments is preferably effected by milling them with a dispersant and said second polymeric binder in an organic solvent. A precondition is that said second polymeric binder used for predispersing the colored pigments, the dispersant and the binder of the photosensitive layer, referred to as first polymeric binder, are compatible. This means that solutions of these materials must be homogeneously miscible with one another and exhibit no incompatibilities through precipitation or turbidity. Expediently, the binder of the photosensitive layer can, if possible, also be used as a binder for the dispersion.

All conventional materials which are also known for paints and finishes are structurally suitable as organic coloured pigments to be used. The pigments to be chosen are functionally restricted by virtue of the fact that their absorption maximum should not correspond to that of the diazo resin and or the photoinitiator. A distance between these absorption maxima of at least 100 nm is preferred. The following may be mentioned as examples of possible pigment classes: indigoids, azo, dioxazine, quinacridone, phthalocyanine, isoindolinone, perylene and perinone, metal complex, alkali blue and diketopyrrolopyrrole (DDP) pigments.

Owing to their colour location and their colour strength, the phthalocyanine pigments are preferred, for example the widespread Cu phthalocyanine pigments, phthalocyanine substituted centrally by other metal atoms (Al, Ti, etc.) or the metal-free phthalocyanine itself (=®Heliogenblau D7490; Color Index No. 74 100; Pigment Blue 16). Phthalocyanines which are substituted in a manner which improve the dispersibility through better compatibility with the surrounding medium are preferred. Such phthalocyanines are described, for example, in WO 99/51690.

The content of the dispersed pigments is in general from 2 to 20% by weight, preferably from 4 to 12% by weight, based in each case on the total weight of the dispersion.

By definition, dispersions are systems in which an insoluble solid phase is present finely distributed (disperse) in a liquid medium. Once the particles have been introduced into the disperse phase, there exist between them various interactions which determine the stability of the dispersion. The destabilizing part is mainly due to van der Waals forces which can result in coagulation or aggregation through attraction of the particles. Stabilizing effects, which however have only a short range, are electrostatic and steric interactions of the particles among one another. As a rule, the attractive forces dominate so that the dispersion has to be stabilized using a dispersant. This should strengthen the repulsive forces between the particles and thus compensate or overcome the attractive parts due to the van der Waals forces.

There are essentially two concepts for this—electrostatic and steric stabilization. In both cases, the dispersant is adsorbed superficially onto the particles. In one case, it is an ionic system so that two identically charged particles repel one another. In the case of steric stabilization, polymers are adsorbed onto the surface of the particles. Their polymer chains then form a covering around the particles to be dispersed (thickness from about 10 to 100 nm), which, mainly for entropic reasons, prevents the particles from coagulating. It is known that polymers which have no affinity or only little affinity to the particle surface also have an advantageous effect on the stability of the dispersion (polymer effect). The stable dispersion which is described in the non-prior-published DE-A 199 15 717 and which could be used in a printing plate coating solution is also based on this effect. There, it was clear that the dispersion is not stabilized or is stabilized only to a very small extent by adsorption effects of the binder (carboxy-functionalized polyvinylbutyral), since the molecular weight is too high for a pure dispersant. Compounds which have a molecular weight of more than 20 000 and moreover possess functional groups having strong affinity to the particle surface tend to be known flocculants. A plurality of functional groups of a very long polymer molecule then bond to various particles and thus combine them into a larger insoluble unit.

For the invention described here, it is therefore important to distinguish between the dispersion binder (see below) and the dispersant, which is likewise a polymer. In order to ensure good developability of the photosensitive layer, the dispersant should be permanently bound to the surface of the pigment particle (both in the solid state of the coated printing plate and on redissolution of the layer during the development process), so that there is here no aggregation of the pigment particles, which causes strong residual fogging on the developed plate.

The dispersion described in the present invention is thus based on dispersants which are adsorbed permanently on the pigment through anchor groups and thus avoid the described problem of strong residual fogging after the development in combination with high initial drying temperatures (film quality).

The dispersants are generally polymers which also contain a plurality of different monomer units. In the case of two or more different monomer units, these may be randomly distributed or ordered. The latter case may involve a block copolymer or a graft copolymer. If the various monomer units are randomly distributed, then the copolymer (in the present case, this is to be understood as meaning polymers having two or more different monomer units, i.e. also terpolymers, quaterpolymers, etc.) generally has an average molecular weight $M_w$ in the range from 1 000 to 30 000, preferably from 2 000 to 20 000. Polymers having a molecular weight $M_w$ of more than 30 000 lead to coagulation of the pigment particles under the conditions described. Block copolymers preferably contain a block having a molecular weight $M_w$ in the range from 500 to 10 000, which has monomer units having groups with affinity to the pigments, and at least one further block without such groups having affinity to the pigments. The latter groups generally have a molecular weight $M_w$ of from 500 to 100 000, preferably from 1 000 to 20 000. The molecular weight $M_w$ of all blocks together should preferably be not more than 120 000.

Graft copolymers suitable as dispersants generally contain grafted-on side chains having a molecular weight $M_w$ from about 600 to 3 000.

The polymer considered as dispersant must be compatible with the dispersion solvent and with the optionally different coating solvent. In a test, mixtures of the 10% strength solutions of dispersant and dispersion binder may not undergo phase separation or lead to precipitates after mixing.

Polymers suitable as dispersants preferably contain amino groups as anchor groups, which are responsible for the adhesion to the pigment. The amino groups may be primary, secondary or tertiary amines. Functional derivatives of amino groups are also possible as anchor groups. Here, in particular amides, imides, lactams, urethanes, ureas, pyridines and other nitrogen heterocycles (containing nitrogen with a free electron pair) are possible.

Depending on the pigment surface, other functional groups may also have sufficient pigment affinity to remain adsorbed there permanently. Examples of these are carboxylates, phosphonates or sulphonates (including other polar organic derivatives of phosphorus or of sulphur). Very generally, these may be cationic or anionic functional groups. The polymer parent structure of the dispersant is chosen so that it is compatible with the dispersion solvent and with the coating solvent—which optionally differs therefrom. If in each case 10% strength by weight solutions of the dispersant and of the dispersion binder are mixed, no phase separation may occur and furthermore no precipitates may form. The polymeric parent structure is substantially responsible for the formation of a polymeric covering around the pigment. For steric stabilization, the covering projects into the solvent medium and thus prevents aggregation of the pigments with one another.

The polymer parent structure may originate from various polymer classes. For example, the following may be mentioned as main classes: polyolefins, polyalkylene glycols and ethers derived therefrom, polyacrylates, polyesters, polyamides, polyurethanes, polyimides, polyethers, polyetherketones, polyethersulphones, novolaks, polyureas, polysulphides, poly(meth)acrylic acids, poly(meth)acrylamides, polyvinylpyrrolidones, polyvinylcaprolactams, polyvinylimidazoles, polyvinyl alcohols, polyethyleneimines and corresponding copolymers. The designation "copolymers" is to be understood as meaning polymers having two or more different monomer units. The polymer parent structure can be combined virtually as desired with the anchor groups mentioned.

The anchor groups may be bonded to the polymer main chain or to side groups or side chains. A further subdivision into random, block-forming and terminal group-modified systems can then be made.

In the simplest case, the dispersant is a random copolymer which contains monomer units having anchor groups. The copolymer can be produced, for example, by polycondensation or polyaddition. Examples thereof are copolymers having units of methyl methacrylate (or other acrylate monomers) and of 2-dimethylaminoethyl methacrylate. It is just as possible to attach the anchor groups to a polymer by a polymer-analogous reaction. An example of this is the etherification or esterification of the hydroxyl groups in polymers which contain 2-hydroxyethyl methacrylate groups. Dispersants having such a parent structure adhere via their anchor groups to the surface of the pigment particles, while the remainder of the polymer chain projects in loops of various sizes (due to the random distribution) in the liquid phase and thus serves as a steric spacer.

In order to adjust the steric screening further, further polymer chains can be grafted onto an existing parent polymer (graft polymers). Such polymers are described in the literature also under the name "comb polymers". An example of these is a copolymer having units of methyl methacrylate (or another acrylate monomer), of 2-dimethylaminoethyl methacrylate, of lauryl methacrylate and of 2-hydroxyethyl methacrylate (HEMA). This copolymer can be further functionalized with oligomeric or polymeric chains, for example by short-chain polycaprolactam whose terminal group is bonded to the HEMA unit with the aid of an excess of tolylene 2,4-diisocyanate (TDI).

It is also possible to add monomers having longer side chains during the polymerization. An example of this is a copolymer having units of methyl methacrylate (or another acrylate monomer), of 2-dimethylaminoethyl methacrylate and of lauryl methacrylate or polyethylene glycol methacrylate ($M_n$ about 1 000).

Dispersants in which the anchor groups are part of the polymer main chain are also suitable. These polymers, too, can be further modified by grafting. An example of this is a polyethyleneimine which is grafted by reaction with an excess of octadecyl bromide or a halogen-substituted polypropylene glycol monoether.

The abovementioned dispersants having a random distribution of the anchor groups (including the grafted types) generally have a molecular weight (number average $M_n$) of from 1 000 to 30 000, preferably from 2 000 to 20 000. As a rule, polymers having a higher molecular weight no longer have the desired effect. Instead, coagulation of the pigment particles occurs.

A disadvantage of the dispersant in which the anchor groups are randomly distributed on a polymer chain is that the anchor groups may be relatively far apart and in principle there therefore tends to be a danger of a coagulation effect. This danger no longer exists in the case of block copolymers which have both blocks with anchor groups as side groups and blocks which are free of anchor groups and therefore project into the liquid phase. Such block copolymers can be prepared, for example, by a living anionic polymerization of acrylate monomers, by polymerization of macroinitiators, by living free radical polymerization or by combination reactions of blocks functionalized with terminal groups. The polymer parent structure can in turn be selected from the abovementioned polymer class. Just as suitable are block copolymers having blocks which contain the anchor groups as part of the polymer main chain. A block copolymer of this type can be obtained, for example, by ring-opening polymerization of ε-caprolactone, reaction of the terminal groups with TDI and reaction with the remaining isocyanate groups from the TDI with an excess of triethylenetetramine or an unbranched polyethyleneimine (having about 14 ethyleneimine units). The blocks containing anchor groups having affinity to the pigments are adsorbed on the pigment surface during the dispersing process and will remain permanently anchored there, while the blocks without such groups project into the liquid phase of the dispersion for steric stabilization and thus prevent aggregation of the pigment particles.

The dispersants having a block copolymer structure are not necessarily limited to A-B systems (A=anchor block, B=polymer block without anchor groups). A-B-A, B-A-B, A-B-A-B and other compositions having a larger number of blocks are also possible. In all these block copolymers, the block A preferably has a molecular weight $M_n$ of from about 100 to 3 000, preferably from about 200 to 1 000, and the soluble polymer block B has a molecular weight $M_n$ of from about 500 to 50 000, preferably from 1 000 to 10 000.

In the extreme case, the anchor block can be reduced in size to such an extent that it contains only a few anchor groups or even only a single anchor group. Such polymers can also be used as dispersants. Here, the soluble polymer moiety is more important since it must ensure the steric screening of the pigment but simultaneously also as high a density as possible of dispersant polymer on the surface of the pigment. A dispersant of this type can be prepared by ring-opening polymerization of ε-caprolactone, reaction of the terminal groups with TDI, followed by reaction of the remaining isocyanate groups in the TDI with N-(2-aminoethyl) morpholine or with 2-(2-aminoethyl)pyridine.

The dispersant or the mixture of different dispersants is used in general in an amount of from 5 to 50% by weight, preferably from 10 to 30% by weight, based in each case on the weight of the coloured pigment used.

In association with the present application, only those polymers which are not permanently bound to the coloured pigments by chemisorption or physisorption are referred to as dispersion binders. It is thus also possible to realize higher molecular weights than in the case of the dispersants. The properties introduced via the binder are more for achieving steric screening of the pigments through the viscosity of the solution and the molecular weight and thus to a lesser extent also for contributing to the stability of the dispersion. The structure of the binders to be used can therefore vary greatly. In principle, all polymers which are in the molecular weight range from 10 000 to 1 000 000, preferably from 2 000 to 500 000, and are soluble in the solvents used for the dispersion are suitable, for example polyolefins, polyalkylene glycols or their ethers, polyacrylates, polyesters, polyamides, polyurethanes, polyimides, polyethers, polyetherketones, polyethersulphones, novolaks, polyols, polyureas, polysulphides, polycarboxylic acids, polyacrylamides, polyvinylpyrrolidones, polyvinylcaprolactams, polyvinylimidazoles, polyvinyl acetates and their copolymers. Their suitability for use is mainly restricted by the required compatibility with the components used in the dispersion and in the photosensitive layer, in the sense that no separation phenomena due to inhomogeneities in the solution as well as in the layer should occur here. A material structurally similar to the film-forming polymer used in the photosensitive layer is preferably to be used, the use of the identical material being particularly preferred.

The amount of the dispersion binder is in general from 2 to 30% by weight, preferably from 5 to 20% by weight, based on the total weight of the dispersion.

For the preparation of the dispersion, the coloured pigments are first predispersed in the presence of the dispersant. The predispersing of the coloured pigments is generally carried out in polar organic solvents. Examples of these are ethylene glycol monomethyl ether, diethylene glycol monomethyl ether, N-methylpyrrolidone, ethylene glycol monobutyl ether acetate or γ-butyrolactone. Mixtures of different solvents with one another or, in compatible amounts, with water may also be used. The amount of the polar organic solvent is in general from 50 to 96% by weight, based on the total weight of the coloured pigment dispersion. The binder for the dispersion can be added as a solid but is preferably predissolved in a small amount of solvent. In a further possible but less preferred embodiment, the dispersant can also be used only later, during preparation of the coating solutions. In this case, however, it is expedient first to stir coloured dispersion, solvent and dispersing additives with one another for about 1 hour.

The coloured pigment dispersion can be prepared using customary apparatuses known to a person skilled in the art, in particular using a ball mill. The predispersed mixture is milled in a ball mill with addition of glass beads or ceramic beads (diameter of the grinding beads about 1 mm). Optimum results are obtained if the milling process is repeated several times. On examination under the transmitted-light microscope, no particles having a diameter of more than 3 μm should be visible. The stability of the coloured pigment dispersion is sufficient if the radiation-sensitive mixture coloured therewith can be stored for 3 days at room temperature without solid components settling out during this time.

The coloured pigment dispersion is added to the negative-working mixture in an amount such that the amount of pure coloured pigments is from about 2 to 20% by weight, preferably from 3 to 15% by weight, based in each case on the total weight of the nonvolatile components of the negative-working radiation-sensitive layer produced therefrom.

The radiation-sensitive component in the negative-working radiation-sensitive layer is preferably a diazonium salt or a combination of a polymerizable monomer or oligomer and a photopolymerization initiator. The film-forming, polymeric binders used may be those which are generally customary in such mixtures. These are those which are insoluble in water but soluble or at least swellable in aqueous alkali. In a particularly preferred embodiment, the binder for dispersing said pigment is identical with the film-forming, organic binder.

The photosensitive diazonium salt is preferably a condensate of an aromatic diazonium salt. Such condensates are disclosed, inter alia, in DE-A 12 14 086 (=U.S. Pat. No. 3,235,384). They are generally prepared by condensation of a polynuclear aromatic diazonium compound, preferably of substituted or unsubstituted diphenylamine-4-diazonium salts with active carbonyl compounds, preferably formaldehyde, in a strongly acidic medium, preferably concentrated phosphoric acid. U.S. Pat. Nos. 3,867,147 and 4,021,243 describes condensates which additionally contain units which are formed by condensation and which are free of diazonium salt groups and preferably derived from aromatic amines, phenols, phenol ethers, aromatic thioethers, aromatic hydrocarbons, aromatic heterocyclic compounds or organic acid amides.

The diazonium salt polycondensate thus preferably contains repeating units $R-N_2X$ which are linked to one another by intermediate members which are derived from condensable carbonyl compounds, in particular from formaldehyde, R being an aromatic radical containing at least two benzene rings and X being an anion. The diazonium salt polycondensate may also consist of repeating units $A-N_2X$ and B, which are linked to one another by intermediate members, preferably methylene groups, which are derived from condensable carbonyl compounds, A being the radical of an aromatic diazonium compound condensable with formaldehyde and B being the radical of a compound free of diazonium groups and condensable with formaldehyde, in particular of an aromatic amine, of a phenol, of a phenol ether, of an aromatic thioether, of an aromatic hydrocarbon, of an aromatic heterocyclic compound or of an organic acid amide. It may also be a product having repeating units $A-N_2X$ and B which are linked by divalent intermediate members derived from a condensable carbonyl compound. The diazonium salt units $A-N_2X$ are preferably derived from compounds of the formula $$(R^1-R^2-)_p R^3-N_2X$$

in which

X denotes an anion, p denotes an integer from 1 to 3, $R^1$ denotes an aromatic radical having at least one position capable of condensation with an active carbonyl compound, $R^2$ denotes a single bond or one of the groups 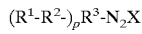—NR$^4$—, —(CH$_2$)$_r$—NR$^4$—, —S—(CH$_2$)$_r$—N$^4$, —S—CH$_2$—CO—NR$^4$—, —O—R$^5$—O—, —O—, —S— or —CO—NR$^4$—, in which q is a number from 0 to 5, r is a number from 2 to 5, $R^4$ is hydrogen, an alkyl group having 1 to 5 C atoms, an aralkyl group having 7 to 12 C atoms or an aryl group having 6 to 12 C atoms and $R^5$ is an arylene group having 6 to 12 C atoms, and $R^3$ denotes an optionally substituted (p+1)-valent benzene radical. The (p+1)-valent benzene radical is preferably substituted by $(C_1-C_4)$alkoxy or $(C_1-C_6)$alkyl groups. p is preferably 1, which means that $R^3$ is preferably an optionally substituted phenylene group. The anion X is preferably chloride, sulphate or phosphate or an optionally substituted alkanesulphonate having 1 to 4 carbon atoms, e.g. methanesulphonate, or an aminoalkanesulphonate, as described in EP-A 224 162. If the $(C_1-C_4)$ alkanesulphonate is substituted, it is preferably substituted by amino or alkoxy groups.

Condensates which are derived from optionally substituted diphenylamine-4-diazonium salts, in particular from 3-methoxydiphenylamine-4-diazonium salts, are preferred, and among these the readily obtainable condensates with formaldehyde. The optionally present substituents are preferably $(C_1-C_4)$alkoxy or $(C_1-C_6)$alkyl groups. The condensation can be carried out in particular in concentrated sulphuric, phosphoric or methanesulphonic acid, in particular in phosphoric acid. In the latter case, the condensate can be used as a crude condensate, i.e. the approximately 50% strength by weight solution in phosphoric acid, obtained in the condensation, can be used directly. This has the advantage that the phosphoric acid preferred for stabilizing the condensate in the mixture is already present. Sulphuric acid, methanesulphonic acid, para-toluenesulphonic acid and citric acid are also suitable for stabilization. An excess of acid is frequently advantageous, so that even more phosphoric acid can be added in addition to that contained in the crude condensate.

Particularly suitable film-forming binders are polymers having vinyl alcohol units. Polyvinyl alcohols and polyvinylacetals which still have free hydroxyl groups are particularly preferred. However, other polymers containing hydroxyl groups, such as epoxy resins or homo- or copolymers having hydroxyalkyl (meth)acrylate units, are also suitable. In order to render the binders usable for the purposes of the present invention, they are rendered alkali-soluble by reaction with an intramolecular di- or polycarboxylic anhydride. In principle, both aliphatic or cycloaliphatic and aromatic or heteroaromatic intermolecular di- or polycarboxylic anhydrides are suitable. Among the (cyclo)aliphatic di- or polycarboxylic anhydrides, maleic anhydride, dimethylmaleic anhydride, citraconic anhydride, succinic anhydride, glutaric anhydride, cyclohexene-1,2-dicarboxylic anhydride and camphoric anhydride may be mentioned. Particularly preferred aromatic anhydrides are phthalic anhydride or trimellitic anhydride. However, naphthalene-2,3-dicarboxylic anhydride or naphthalene-1,8-dicarboxylic anhydride and heteroaromatic acid anhydrides, such as furan- or thiophene-2,5-dicarboxylic anhydride, are also suitable. Reaction products with aromatic carboxylic anhydrides lead to printing plates having improved stability, so that a longer print run can be achieved. For this reason, aromatic and heteroaromtic carboxylic anhydrides are preferable to the aliphatic or cycloaliphatic ones. As a result of the reaction with the carboxylic anhydride, the polymeric binder used for dispersing generally has an acid number of from 20 to 200, preferably from 30 to 150, particularly preferably from 40 to 120; its average molecular weight $M_w$ is in general from 10 000 to 300 000, preferably from 20 000 to 200 000. It has proved particularly advantageous to carry out the reaction of the polymeric binder containing hydroxyl groups with the aromatic di- or polycarboxylic anhydrides in the presence of an organic or inorganic base, such as triethylamine or sodium carbonate.

Furthermore, the polyol-based binders described can be mixed in a range up to 50%, based on the total binder (P), preferably 40w, with other carboxyl-functionalized polymers and can be used in the photosensitive layer. This has the particular advantage that many commercially and economically available polymers containing acid groups can thus be used. In particular, the following may be mentioned as possible additives here: copolymers having units of acrylic acid, methacrylic acid, itaconic acid, crotonic acid, fumaric acid, maleic acid, maleic anhydride (these may optionally be hydrolyzed to the corresponding monoesters), but also polyurethanes, polyesters or polyethers having carboxyl groups, so that the requirements with respect to molecular weight and acid number are met within the same limits as in the case of the polyol-based polymers described above.

The polymerizable monomer or oligomer which is only optionally present is generally an ethylenically unsaturated compound, preferably an ester or amide of acrylic, methacrylic, fumaric or maleic acid. Among these in turn, the compounds having more than one polymerizable double bond are preferred. These include, for example, the esters of said acids with alkanediols, poly- or oligoethylene glycols, poly- or oligopropylene glycols, poly- or oligobutylene glycols and other bifunctional low or high molecular weight organic diols. The esters of polyhydric alcohols, such as glycerol, trimethylolethane, trimethylolpropane or pentaerythritol, isocyanuric acid, the ethoxylated or propoxylated derivatives thereof, and dimers or oligomers of these compounds are particularly suitable. A degree of esterification which is as high as possible is advantageous in this case. Amides, for example the compounds which are formally formed in the reaction of ethylenediamine or its oligomers with the acids described, can also be used. The amount of the polymerizable monomers and/or oligomers is from about 5 to 80% by weight, preferably from about 10 to 60% by weight, based in each case on the total weight of the nonvolatile components of the radiation-sensitive layer.

Depending on the desired sensitization range, different materials were used as photopolymerization initiators which initiate the polymerization of the polymerizable monomer or oligomer under the action of actinic radiation, in particular visible or UV light. If the photosensitive material is to be sensitive to the near-UV range (from 350 to 420 nm) customary for offset printing, the photoinitiator systems used differ from those which are to be used if exposure is to be effected in the visible spectral range, for example using laser radiation.

The photoinitiators to be exposed in the near-UV range should absorb light in the range from about 250 and 500 nm with formation of free radicals. Examples are acyloins and their derivatives, such as benzoin, benzoin alkyl ethers, vicinal diketones and their derivatives, e.g. benzil, benzil acetals, such as benzil dimethyl ketal, fluorenones, thioxanthones, polynuclear quinones, acridines and quinoxalines, and furthermore trichloromethyl-s-triazines, 2-halomethyl-4-vinyl[1,3,4]oxadiazole derivatives, halooxazoles substituted by trichloromethyl groups, carbonylmethylene heterocycles containing trihalomethyl groups and acylphosphine oxide compounds. The photoinitiators can also be used in combination with one another or with coinitiators or activators, for example with Michler's ketone or with a derivative thereof or with a 2-alkylanthraquinone. In the case of the photoinitiators used in particular for exposure in the visible range, mixtures of metallocenes, photoreducible dyes, photolytically cleavable compounds having trihalomethyl groups and optionally further initiator and dye components are generally suitable, as described in EP-A 364 735. The metallocene component consists of variously substituted cyclopentadienyl complexes of titanium or of zirconium. The photoreducible dyes used may be xanthene, benzoxanthene, benzothioxanthene, thiazine, pyronine, porphyrine or acridine dyes. In the case of the trihalomethyl coinitiators, the known triazine derivatives with bromine or chlorine as halogen have proved particularly useful. In addition, the initiator contains, for example, acridine, phenazine or quinoxaline derivatives for increasing the sensitivity in the near-UV range and, for example, dibenzalacetones or coumarins for increasing the sensitivity in the visible range.

The amount of the photoinitiator or of the initiator combination is in general from about 0.1 to 15% by weight, preferably from about 0.5 to 10% by weight, based in each case on the total weight of the nonvolatile components of the radiation-sensitive layer.

The photopolymerizable layer may furthermore contain stabilizers for suppressing thermal polymerization, plasticizers or other assistants for improving the mechanical or reprographic quality. In principle, it should be ensured that the added substances do not absorb an excessive proportion of the actinic light required for the polymerization and thus reduce the practical photosensitivity.

In order to be able to pump out more rapidly the air between the photographic transparency and the radiation-sensitive recording material in the vacuum printing frame, it has proved expedient to pigment the surface of the recording material or to render said surface matt. Pigmentation is generally preferred to rendering matt. The pigmentation is achieved with the aid of water-insoluble, generally inorganic particles having a mean particle size of from 0.1 to 20 $\mu$m, preferably from 1.0 to 15 $\mu$m. Particles which are transparent to the radiation used for the imagewise exposure are particularly advantageous. This applies, for example, to silica particles. The particles can be incorporated into the radiation-sensitive layer or into a release layer optionally present thereon. The pigmented surface generally has a Bekk smoothness of from 20 to 250 s (determined according to DIN 53 107, method A). Processes for the production of the matt effect or pigmentation and suitable materials therefor are known to a person skilled in the art (for example from EP-A 1 031 881).

In order to render the mixture flowable so that it can be applied to a substrate material, an organic solvent is also expediently added. For example, alcohols, ketones, esters or ethers are generally suitable. Partial ethers or ether-esters of alkylene glycols (in particular ethylene glycol and propylene glycol) dialkylene glycols or polyalkylene glycols are particularly advantageous. Diethylene glycol mono($C_1$–$C_6$) alkyl ethers, especially diethylene glycol monomethyl ether or monoethyl or monobutyl ether, may be mentioned by way of example. In order to achieve good levelling of the layer and a uniform layer surface, the coating solvent preferably comprises low-boiling (boiling point at atmospheric pressure less than 150° C., preferably from 50 to 120° C.; examples: tetrahydrofuran, ethylene glycol monomethyl ether) as well as high-boiling (boiling point at atmospheric pressure greater than 180° C.; examples: diethylene glycol mono($C_1$–$C_6$)alkyl ethers) organic solvents. The high-boiling solvents are expediently identical to those which are used in the dispersing of the coloured pigments.

Suitable substrates are sheets, foils or strips of metal, plastic or plastic/metal laminates (aluminium/polyester laminates may be mentioned by way of example here). However, metallic substrates, in particular those comprising aluminium or an aluminium alloy, are preferred. The aluminium substrates are usually roughened mechanically, chemically and/or electrochemically, if required also anodically oxidized and/or provided with a chemical aftertreatment. Polymers or polycondensates with phosphonic acid, carboxyl groups or sulpho groups which optionally also contain units having basic groups (in particular amino groups) may be mentioned here by way of example. Furthermore, silicates, phosphates, fluorides or fluoro complexes are suitable for the aftertreatment. It is also possible to combine a plurality of these pretreatments.

It is frequently advantageous to provide the substrate with a backing coating of polymeric materials, as described, inter alia, in DE-A 100 29 157. This applies in particular to metallic substrates, especially to aluminium substrates.

The radiation-sensitive mixture can be applied to the substrate by spin-coating or pouring on or by other generally customary and known methods. The coating is then dried, for example in a forced-circulation oven. The weight of the dried, radiation-sensitive layer is in general from 0.3 to 3.0 g/m², preferably from 0.5 to 2.0 g/m², particularly preferably from 0.6 to 1.6 g/m².

The radiation-sensitive recording material is then exposed imagewise. Depending on the type of photosensitive component, UV, visible or IR radiation may be used. In general, exposure is effected through a photographic transparency. For this purpose, the transparency is placed directly on the radiation-sensitive layer in a vacuum printing frame. Before exposure, the air remaining between the photographic transparency and the recording material is pumped out.

After the imagewise exposure, the recording material is developed with an aqueous alkaline solution suitable for negative-working recording materials. Such solutions are known and are described, for example, in DE-A 197 55 295. A particularly suitable developer contains at least one, .compound which is alkaline in water, at least one emulsifier, at least one water-miscible organic solvent and at least one surfactant. The alkaline compound is preferably an alkanolamine (in particular ethanolamine, di- or triethanolamine, isopropanolamine, diisopropanolamine or trishydroxymethylaminomethane), a hydroxide (in particular alkali metal or alkaline earth metal hydroxides), a phosphate or a carbonate (in particular sodium, potassium or ammonium carbonates or bicarbonates). The amount of the alkaline compound is in general from 0.1 to 20% by weight, in particular from 0.5 to 10% by weight, based in each case on the total weight of the ready-to-use developer. Its pH is in general from 8 to 13, preferably from 8.5 to 11.5 The emulsifier is in general a copolymer having units of hydrophobic vinyl compounds and hydrophilic, ethylenically unsaturated carboxylic acids, some of the carboxyl groups of the copolymer also having been esterified. The amount of the emulsifier is in general from 0.1 to 10% by weight, preferably from 0.2 to 8.0% by weight.

In this context, those organic solvents which, in the amount used (up to about 20% by weight), form a uniform solution with water at a temperature at which developers are usually stored or used (from about 0 to 60° C.) are referred to as "water-miscible". Particularly suitable organic solvents are alcohols, such as benzyl alcohol, ethylene glycol monophenyl ether, 1- or 2-phenylethanol, glycerol or glyceryl acetates. The amount of these solvents is in general from 0.5 to 15.0% by weight, in particular from 1.0 to 10.0% by weight, particularly preferably from 2.0 to 6.0% by weight, based in each case on the total weight of the ready-to-use developer.

Among the surfactants, the anionic surfactants are particularly suitable. In addition, mixtures of anionic with nonionic or zwitterionic surfactants can also be successfully used. Anionic surfactants, such as alkali metal octylsulphates, dodecylbenzenesulphonates, alkylphenolethersulphates, naphthalenesulphonates, sulphosuccinates and alkyletherphosphates, have proved particularly useful. Nonionic surfactants originate, for example, from the substance classes consisting of the ($C_{10}$–$C_{18}$) fatty alcohol ethoxylates, of the polyethylene glycols, ethylene oxide/propylene oxide (block) copolymers and alkylphenol ethoxylates. The amount of the surfactants is in general from 0.2 to 12.0% by weight, preferably from 0.5 to 8.0% by weight, particularly preferably from 1.0 to 6.0% by weight, based on the total weight of the developer.

After the development, the parts which subsequently accept the printing ink are distinguishable from the substrate material through being clearly visible and having high contrast. The difference in the optical density between the (bared) substrate and the layer parts, determined by reflection densitometry using a cyan filter, is as a rule at least 0.8. The pigmentation of coloured pigments results in neither impairment of the development process nor reduction in the print run. Owing to the high contrast, the printing plate thus obtained can, if necessary, be particularly easily corrected. Even more important is the effect that the proportion of the printing parts of the plate can be particularly reliably detected by a scanner. Printing plates which can readily achieve print runs of from 250 000 to 300 000 prints can be produced from the recording material according to the invention.

The following examples are intended to illustrate the invention. pbw represents part(s) by weight therein. Percentages are percentages by weight, unless stated otherwise. Comparative examples and comparative substances are indicated by an asterisk (*)

EXAMPLES

The diazonium salt used in the example was in each case a diazonium salt polycondensate prepared from equimolar amounts of 3-methoxydiphenylamine-4-diazonium sulphate and 4,4'-bismethoxymethyldiphenyl ether in 85% strength phosphoric acid, isolated as mesitylenesulphonate.

In addition, the following polymeric binders were used:

P 1: A polyvinylbutyral having an average molecular weight $M_w$ of about 37 000, which contained 71 mol % and vinylbutyral units, 27 mol % of vinyl alcohol units and 2 mol % of vinyl acetate units and had been reacted, in a mixture of γ-butyrolactone and butanone (mixing ratio 1 pbw:2 pbw) in the presence of triethylamine, with benzene-1,2,4-tricarboxylic anhydride (=trimellitic anhydride); the reaction product precipitated in water had an acid number of about 100 mg KOH/g P 2: A polyvinylbutyral having an average molecular weight $M_w$ of about 80 000, which contained 71 mol % and vinylbutyral units, 27 mol % of vinyl alcohol units and 2 mol % of vinyl acetate units and had been reacted, in diethylene glycol monomethyl ether (methyldiglycol) in the presence of anhydrous sodium carbonate, with phthalic anhydride; the reaction product precipitated in water had an acid number of about 70 mg KOH/g P 3: A copolymer consisting of units of vinylpyrrolidone (19%), tert-butyl acrylate (73%) and acrylic acid (8%), having an average molecular weight $M_n$ of 20 000 and a dispersity of 2. The measured acid number of the material was 65.

P 4: A maleic anhydride/styrene copolymer functionalized (with butyl and methyl alcohol), from Monsanto (scripset 550) and having the following properties: Mw about 100 000, acid number 200. The following were used as dispersants (DIS):

DIS 1: Ethylene glycol/propylene glycol copolymer having a terminal amino group functionality ($M_n$ about 3 500)

DIS 2: Random copolymer consisting of units of methyl methacrylate, 2-hydroxyethyl methacrylate and 2-dimethylaminoethyl methacrylate (molar ratio about 0.5:0.42:0.08; molecular weight $M_n$ about 10 000)

DIS 3: Block copolymer comprising a block of polycaprolactone (polyester-6) and a block of unbranched polyethyleneimine (about 14 ethyleneimine units), which is bonded via units of TDI (tolylene 2,4-diisocyanate) to the polyester block Pigments:

PG 1: Hostapermblau B2G (Pigment Blue 15:3; CI 74160; Clariant)

PG 2: Heliogenblau D7490 (Pigment Blue 16; CI 74100; BASF)

PG 3: Chromophthalblau A3R (Pigment Blue 60; CI 69800; Ciba)
PG 4: Paliogenschwarz S 0084 (Pigment Black 31; CI 71132; BASF) Monomers and initiator
M1: Hexafunctional aromatic urethane acrylate (®Ebecryl 220 from UCB Radcure)
M2: Water-soluble aliphatic urethaneacrylate (®Ebecryl 2001 from UCB Radcure)
T1: 2-Benzo[1,3]dioxol-5-yl-4,6-bistrichloromethyl[1,3,5] triazine The coloured pigment dispersion shown in table 1 were first prepared using the polymeric binders in the manner described above in a stirred ball mill (MEK represents methyl ethyl ketone=butanone, NMP=N-methylpyrrolidone).

TABLE 1

| | Binder | DIS | | Pigment | | Solvent | | Solid |
|---|---|---|---|---|---|---|---|---|
| D1 | P2 | 8 | — | — | PG1 | 8 | MEK | 84 | 16 |
| D2 | P2 | 8 | DIS1 | 2 | PG1 | 8 | MEK | 82 | 18 |
| D3 | P2 | 8 | DIS2 | 2 | PG1 | 8 | MEK | 82 | 18 |
| D4 | P2 | 8 | DIS3 | 2 | PG1 | 8 | MEK | 82 | 18 |
| D5 | P1 | 12 | — | — | PG2 | 6 | NMP | 82 | 18 |
| D6 | P1 | 12 | DIS3 | 0.6 | PG2 | 6 | NMP | 81.4 | 18.6 |
| D7 | P1 | 12 | DIS3 | 0.6 | PG3 | 6 | NMP | 81.4 | 18.6 |
| D8 | P1 | 12 | DIS3 | 0.6 | PG4 | 6 | NMP | 81.4 | 18.6 |
| D9 | P3 | 8 | — | — | PG1 | 8 | MEK | 84 | 16 |
| D10 | P3 | 8 | DIS1 | 1.5 | PG1 | 8 | MEK | 82.5 | 17.5 |
| D11 | P4 | 8 | DIS1 | 1.5 | PG1 | 8 | NMP | 82.5 | 17.5 |
| D12 | P1 | 18 | DIS1 | 3 | PG2 | 12 | MEK | 67 | 33 |
| D13 | P1 | 12 | DIS1 | 2.25 | PG2 | 9 | MEK | 76.75 | 23.25 |
| D14 | P1 | 9 | DIS1 | 1 | PG2 | 5 | MEK | 85 | 15 |
| D15 | P1 | 5 | DIS1 | 1.8 | PG2 | 9 | MEK | 84.2 | 15.8 |

The coating mixtures shown in table 2 were then prepared using the coloured pigment dispersions thus obtained. The mixture was thoroughly stirred in each case for at least one hour.

TABLE 2

| Example | Dispersion | Binder | Diazonium resin | Phosphoric acid | PADA | Monomer | Initiator | Dispersant |
|---|---|---|---|---|---|---|---|---|
| 1* | D1 4.06 | P2 1.88 | 2.20 | 0.22 | 0.05 | — | — | — |
| 2 | D1 4.06 | P2 1.84 | 2.16 | 0.22 | 0.05 | — | — | 0.08 |
| 3 | D2 4.06 | P2 1.84 | 2.16 | 0.22 | 0.05 | — | — | — |
| 4 | D3 4.06 | P2 1.84 | 2.16 | 0.22 | 0.05 | — | — | — |
| 5 | D4 4.06 | P2 1.84 | 2.16 | 0.22 | 0.05 | — | — | — |
| 6* | D5 6.67 | P2/P3 (60/40) 1.62 | 1.98 | 0.16 | 0.05 | — | — | — |
| 7 | D6 6.67 | P2/P3 (60/40) 1.59 | 1.96 | 0.16 | 0.05 | — | — | — |
| 8 | D7 6.67 | P2/P3 (60/40) 1.59 | 1.96 | 0.16 | 0.05 | — | — | — |
| 9 | D8 6.67 | P2/P3 (60/40) 1.59 | 1.96 | 0.16 | 0.05 | — | — | — |
| 10* | D9 6.25 | P2 2.07 | 1.71 | 0.17 | 0.05 | — | — | — |
| 11 | D10 6.25 | P2 2.01 | 1.68 | 0.17 | 0.05 | — | — | — |
| 12 | D11 6.25 | P2 2.01 | 1.68 | 0.17 | 0.05 | — | — | — |

TABLE 2-continued

| Example | Dispersion | Binder | Diazonium resin | Phosphoric acid | PADA | Monomer | Initiator | Dispersant |
|---|---|---|---|---|---|---|---|---|
| 13* | D1 4.38 | P1 1.63 | 1.21 | 0.06 | 0.05 | M1 1.21 | T1 0.13 | — |
| 14 | D2 4.38 | P1 1.59 | 1.19 | 0.06 | 0.05 | M1 1.19 | T1 0.13 | — |
| 15 | D2 4.38 | P1 1.59 | 1.19 | 0.06 | 0.05 | M2 1.19 | T1 0.13 | — |
| 16 | D10 4.38 | P2/P4 (60/40) 1.60 | 1.19 | 0.06 | 0.05 | M1 1.19 | T1 0.13 | — |
| 17 | D11 4.38 | P2/P3 (60/40) 1.60 | 1.19 | 0.06 | 0.05 | M1 1.19 | T1 0.13 | — |
| 18 | D12 2.5 | P1 2.66 | 1.33 | 0.13 | 0.05 | — | — | — |
| 19 | D13 3.32 | P1 2.71 | 1.33 | 0.13 | 0.05 | — | — | — |
| 20 | D14 6.00 | P1 2.58 | 1.34 | 0.13 | 0.05 | — | — | — |
| 21 | D15 3.33 | P1 2.95 | 1.34 | 0.13 | 0.05 | — | — | —* |

*Comparative example
The data relate in each case to parts by weight per 100. The difference of the sum of the component from 100 is made up by a 1:1 diethylene glycol monomethyl ether/ethanol solvent mixture.
PADA = 4-Phenylazodiphenylamine (= 4-anilinoazobenzene)

The negative-working mixtures mentioned in table 2 were then each applied to a 300 μm thick aluminium foil by spin-coating, the foil having been roughened beforehand in dilute nitric acid ($R_z$ value according to DIN 4768: 6.0 μm), pickled in dilute sulphuric acid, anodized (oxide weight 2.0 g/m$^2$) and hydrophilized with polyvinylphosphonic acid. After drying (at a/100° C. and b/130° C. for 2 min), the negative-working layer had a weight of 1.0 g/m$^2$.

The recording materials produced in this manner were then exposed imagewise to UV light under a photographic transparency in a vacuum printing frame (irradiation energy about 400 mJ/cm$^2$). They were then developed with a commercial aqueous alkaline developer for negative-working printing plates (Agfa EN 232). The following table 3 shows the characteristics of the individual plates:

Table 3

ΔE calculated from the difference between the Lab values in the nonimage parts of the plates developed by immersion and washing off with hand shower and the substrate developed freely by a mechanical support (immersion times 5 and 10 sec).

TABLE 3

| Example | ΔE 5' Drying 100° C. | ΔE 10' | ΔE 5' Drying 130° C. | ΔE 10' |
|---|---|---|---|---|
| 1* | 3.2 | 1.1 | 10.7 | 3.1 |
| 2 | 2.0 | 0.6 | 2.3 | 0.6 |
| 3 | 1.5 | 0.4 | 1.4 | 0.3 |
| 4 | 1.2 | 0.2 | 1.4 | 0.4 |
| 5 | 0.9 | 0.2 | 1.1 | 0.3 |
| 6 | 4.1 | 0.9 | 8.6 | 2.6 |
| 7 | 1.1 | 0.3 | 1.0 | 0.3 |
| 8 | 1.1 | 0.4 | 1.2 | 0.3 |
| 9 | 1.0 | 0.2 | 1.0 | 0.3 |
| 10* | 4.5 | 0.9 | 9.2 | 2.9 |
| 11 | 1.4 | 0.3 | 1.6 | 0.4 |
| 12 | 0.8 | 0.2 | 0.9 | 0.3 |

TABLE 3-continued

| Example | ΔE 5' Drying 100° C. | ΔE 10' | ΔE 5' Drying 130° C. | ΔE 10' |
|---|---|---|---|---|
| 13* | 3.8 | 1.2 | 11.3 | 3.2 |
| 14 | 0.6 | 0.2 | 0.6 | 0.3 |
| 15 | 0.7 | 0.1 | 0.8 | 0.3 |
| 16 | 0.7 | 0.3 | 0.8 | 0.5 |
| 17 | 0.8 | 0.2 | 0.7 | 0.3 |
| 18 | 0.5 | 0.2 | 0.7 | 0.5 |
| 19 | 0.4 | 0.1 | 0.4 | 0.3 |
| 20 | 0.4 | 0.3 | 0.6 | 0.3 |
| 21 | 0.6 | 0.2 | 0.5 | 0.3 |

What is claimed is:

1. A recording material which comprises a substrate and a negative-working, radiation-sensitive layer which contains organic colored pigments, a radiation-sensitive component and at least a first polymeric binder, which is film-forming, and an organic polymeric dispersant is adsorbed onto the surface of the organic colored pigments, and that the pigments are additionally dispersed in a second polymeric binder which does not permanently combine with the pigments chemically or physically, wherein said first and second polymeric binder may be the same or different and wherein the dispersant is a random copolymer which has monomer units having anchor groups.

2. The recording material according to claim 1, wherein the anchor groups are primary, secondary or tertiary amines or functional derivatives thereof.

3. The record material according to claim 1, wherein the random copolymer has an average molecular weight $M_W$ of from 1,000 to 30,000.

4. The recording material according to claim 3, wherein the random copolymer has an average molecular weight $M_W$ of from 2,000 to 20,000.

5. The recording material according to claim 1, wherein the amount of the at least one dispersant is from 5 to 50% by weight, based on the weight of the colored pigment used.

6. The recording material according to claim 1, wherein the amount of the organic colored pigments is from about 2 to 20% by weight, based on the total weight of the nonvolatile components of the radiation-sensitive layer.

7. The recording material according to claim 1, wherein the radiation-sensitive component in the negative-working radiation-sensitive layer is a diazonium salt or a combination of a polymerizable monomer or oligomer and of a photopolymerization initiator.

8. A recording material which comprises a substrate and a negative-working, radiation-sensitive layer which contains organic colored pigments, a radiation-sensitive component and at least a first polymeric binder, which is film-forming, and an organic polymeric dispersant is adsorbed onto the surface of the organic colored pigments, and that the pigments are additionally dispersed in second polymeric binder which does not permanently combine with the pigments chemically or physically, wherein said first and second polymeric binder may be the same or different and wherein the dispersant is a block copolymer which contains at least one block having anchor groups.

9. The recording material according to claim 8, wherein the organic colored pigment is an indigoid, an azo, dioxazine, quinacridone, phthaocyanine, isoindolinone, perylene, perinone, metal complex, alkali blue or diketopyrrolopyrrole (DDP) pigment.

10. The recording material according to claim 8, wherein the anchor groups are primary, secondary or tertiary amines or functional derivatives thereof.

11. The recording material according to claim 8, wherein the anchor groups are heterocycles containing nitrogen with a free electron pair.

12. The recording material according to claim 8, wherein the anchor groups are amides, imides, lactams, urethanes, ureas or pyridines.

13. The recording material according to claim 8, wherein the at least one block having anchor groups has a molecular weight $M_W$ of from 500 to 1,000 and the molecular weight $M_W$ of all blocks together is not more than 120,000.

14. The recording material according to claim 8, wherein the amount of the at least one dispersant is from 5 to 50 % by weight, based on the weight of the colored pigment used.

15. The recording material according to claim 8, wherein the amount of the organic colored pigments is from about 2 to 20% by weight, based on the total weight of the nonvolatile components of the radiation-sensitive layer.

16. The recording material according to claim 8, wherein the radiation-sensitive component in the negative-working radiation-sensitive layer is a diazonium salt or a combination of a polymerizable monomer or oligomer and of a photopolymerization initiator.

17. The recording material according to claim 8, wherein the substrate is a metallic substrate.

18. A recording material which comprises a substrate and a negative-working, radiation-sensitive layer which contains organic colored pigments, a radiation-sensitive component and at least a first polymeric binder, which is film-forming, and an organic polymeric dispersant is adsorbed onto the surface of the organic colored pigments, and that the pigments are additionally dispersed in second polymeric binder which does not permanently combine with the pigments chemically r physically, wherein said first and second polymeric binder may be the same or different and wherein the second polymeric binder is a polyolefin, polyalkylene glycol, polyalkylene glycol ether, polyacrylates, polyester, polyamide, polyurethane, polyimide, polyether, polyetherketone, polyethersulphone, novolak, polyurea, polysulphide, polycarboxylic acid, polyacrylamide, polyvinylpyrrolidone, polyvinylcaprolactam, polyvinylimidazole or polyvinyl acetate, and that it has a molecular weight $M_W$ from 10,000 to 1,000,000.

19. The recording material according to claim 18, wherein the organic colored pigment is an indigoid, an azo, dioxazine, quinacridone, phthaocyanine, isoindolinone, perylene, perinone, metal complex, alkali blue or diketopyrrolopyrrole (DDP) pigment.

20. The recording material according to claim 18, wherein the dispersant has anchor groups which ensure adsorption on the organic colored pigment.

21. The recording material according to claim 20, wherein the anchor group are primary, secondary or tertiary amines or functional derivatives thereof.

22. The recording material according to claim 18, wherein the dispersant is a block copolymer which contains at least one block having anchor groups.

23. The recording material according to claim 22, wherein the at least one block having anchor groups has a molecular weight $M_W$ of from 500 to 1,000 and the molecular weight $M_W$ of all blocks together is not more than 120,000.

24. The recording material according to claim 18, wherein the amount of the at least one dispersant is from 5 to 50% by weight, based on the weight of the colored pigment used.

25. The recording material according to claim 24, wherein the amount of the at least one dispersant is from 10 to 30% by weight, based on the weight of the colored pigment used.

26. The recording material according to claim 18, wherein the amount of the organic colored pigments is from about 2 to 20% by weight, based on the total weight of the nonvolatile components of the radiation-sensitive layer.

27. The recording material according to claim 26, wherein the amount of the organic colored pigments is from 3 to 15% by weight based on the total weight of the nonvolatile components of the radiation-sensitive layer.

28. The recording material according to claim 18, wherein the radiation-sensitive component in the negative-working radiation-sensitive layer is a diazonium salt or a combination of a polymerizable monomer or oligomer and of a photopolymerization initiator.

29. The recording material according to claim 18, wherein the first polymeric binder is insoluble in water but soluble or at least swellable in aqueous alkali.

30. The recording material according to claim 18, wherein the substrate is a metallic substrate.

31. The recording material according to claim 30, wherein the substrate comprises aluminum or an aluminum alloy.

32. The recording material according to claim 18, wherein the molecular weight $M_W$ is from 2,000 to 500,000.

33. A recording material which comprises a substrate and a negative-working, radiation-sensitive layer which contains organic colored pigments, a radiation-sensitive component and at least a first polymeric binder, which is film-forming, and an organic polymeric dispersant is adsorbed onto the surface of the organic colored pigments, and that the pigments are additionally dispersed in second polymeric binder which does not permanently combine with the pigments chemically or physically, wherein said first and second polymeric binder may be the same or different and wherein the first polymeric binder contains carboxyl groups and has an acid number of between 20 and 200.

34. The recording material according to claim 33, wherein the organic colored pigment is an indigoid, an azo, dioxazine, quinacridone, phthaocyanine, isoindolinone, perylene, perinone, metal complex, alkali blue or diketopyrrolopyrrole (DDP) pigment.

35. The recording material according to claim 33, wherein the dispersant has anchor groups which are primary, secondary or tertiary amines or functional derivatives thereof.

36. The recording material according to claim 33, wherein the dispersant is a block copolymer which contains at least one block having anchor groups.

37. The recording material according to claim 36, wherein the at least one block having anchor groups has a molecular weight $M_W$ of from 500 to 1,000 and the molecular weight $M_W$ of all blocks together is not more than 120,000.

38. The recording material according to claim 33, wherein the amount of the at least one dispersant is from 5 to 50% by weight, based on the weight of the colored pigment used.

39. The recording material according to claim 33, wherein the amount of the organic colored pigments is from about 2 to 20% by weight, based on the total weight of the nonvolatile components of the radiation-sensitive layer.

40. The recording material according to claim 33, wherein the radiation-sensitive component in the negative-working radiation-sensitive layer is a diazonium salt or a combination of a polymerizable monomer or oligomer and of a photopolymerization initiator.

41. The recording material according to claim 33, wherein the substrate is a metallic substrate.

42. A recording material which comprises a substrate and a negative-working, radiation-sensitive layer which contains organic colored pigments, a radiation-sensitive component and at least a first polymeric binder, which is film-forming, and an organic polymeric dispersant is adsorbed onto the surface of the organic colored pigments, and that the pigments are additionally dispersed in second polymeric binder which does nor permanently combine with the pigments chemically or physically, wherein said first and second polymeric binder may be the same or different and wherein the surface is matt or pigmented.

43. The recording material according to claim 42, wherein the organic colored pigment is an indigoid, an azo, dioxazine, quinacridone, phthaocyanine, isoindolinone, perylene, perinone, metal complex, alkali blue or diketopyrrole (DDP) pigment.

44. The recording material according to claim 42, wherein the dispersant has anchor groups which are primary, secondary or tertiary amines or functional derivatives thereof.

45. The recording material according to claim 42, wherein the dispersant is a block copolymer which contains at least one block having another groups.

46. The recording material according to claim 45, wherein the at least one block having anchor groups has a molecular weight $M_W$ of from 500 to 1.000 and the molecular weight $M_W$ of all blocks together is not more than 120,000.

47. The recording material according to claim 42, wherein the amount of the at least one dispersant is from 5 to 50% by weight, based on the weight of the colored pigment used.

48. The recording material according to claim 42, wherein the amount of the organic colored pigments is from about 2 to 20% by weight, based on the total weight of the nonvolatile components of the radiation-sensitive layer.

49. The recording material according to claim 42, wherein the radiation-sensitive component in the negative-working radiation-sensitive layer is a diazonium salt or a combination of a polymerizable monomer or oligomer and of a photopolymerization initiator.

50. The recording material according to claim 42, wherein the first polymeric binder is insoluble in water but soluble or at least swellable in aqueous alkali.

51. The recording material according to claim 42, wherein the pigmentation is achieved with the aid of particles based on $SiO_2$ or $Al_2O_3$ or mixtures thereof.

52. The recording material according to claim 42, wherein the substrate is a metallic substrate.

* * * * *

UNITED STATES PATENT AND TRADEMARK OFFICE
CERTIFICATE OF CORRECTION

PATENT NO.    : 6,667,142 B2                                        Page 1 of 1
DATED         : December 23, 2003
INVENTOR(S)   : Michael Dorr et al.

It is certified that error appears in the above-identified patent and that said Letters Patent is hereby corrected as shown below:

Column 18,
Line 32, "r" should read -- or --.
Line 51, "group" should read -- groups --.

Column 20,
Line 28, "another" should read -- anchor --.

Column 21,
Line 31, "1.000" should read -- 1,000 --.

Signed and Sealed this

Sixteenth Day of March, 2004

JON W. DUDAS
*Acting Director of the United States Patent and Trademark Office*